United States Patent
Tanimoto

[11] Patent Number: 5,906,901
[45] Date of Patent: *May 25, 1999

[54] ALIGNMENT METHOD AND EXPOSURE APPARATUS FOR USE IN SUCH ALIGNMENT METHOD

[75] Inventor: Akikazu Tanimoto, Kanagawa-ken, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/580,886

[22] Filed: Dec. 29, 1995

[30] Foreign Application Priority Data

Jan. 11, 1995 [JP] Japan .................................... 7-002444

[51] Int. Cl.$^6$ ...................................................... G03F 9/00
[52] U.S. Cl. ............................................. 430/22; 356/400
[58] Field of Search ......................... 430/22, 5; 356/400, 356/401

[56] References Cited

U.S. PATENT DOCUMENTS

| | | | |
|---|---|---|---|
| 5,440,138 | 8/1995 | Nishi ....................................... | 356/401 |
| 5,443,932 | 8/1995 | Ohta et al. ................................ | 430/22 |
| 5,448,333 | 9/1995 | Iwamoto et al. .......................... | 355/53 |
| 5,498,501 | 3/1996 | Shimoda et al. .......................... | 430/22 |
| 5,506,684 | 4/1996 | Ota et al. . | |
| 5,528,027 | 6/1996 | Mizutani . | |

*Primary Examiner*—S. Rosasco
*Attorney, Agent, or Firm*—Armstrong, Westerman, Hattori, McLeland & Naughton

[57] ABSTRACT

In a lithographic process for fabrication of integrated circuit chips, a projection exposure machine is used to print a mask pattern onto each of a plurality of shot areas defined on a substrate, where an alignment method for establishing alignment between each shot area on the substrate and the mask pattern is performed. The alignment method comprises the step of forming on the substrate a regular pattern which comprises a plurality of pattern elements regularly distributed over the plurality of shot areas, and the step of performing an alignment operation based on the position of the regular pattern so as to establish alignment between each of the plurality of shot areas and the mask pattern. An exposure apparatus may be used to form the regular pattern on the substrate. The exposure apparatus comprises a light source for emitting a primary light beam, a beam-splitting optical system for splitting the primary light beam into a plurality of secondary light beams which are coherent with each other, and an objective optical system for modifying each secondary light beam into a substantially plane wave light beam, and for illuminating a region of a photoresist-coated substrate with the secondary light beams at different incident angles, the region of the substrate extending over a plurality of shot areas defined on the substrate, wherein the region is exposed to a regular pattern of light of interference fringes produced on the substrate from the plurality of secondary light beams.

37 Claims, 6 Drawing Sheets

ALIGNMENT METHOD AND EXPOSURE APPARATUS FOR USE IN SUCH ALIGNMENT METHOD

BACKGROUND OF THE INVENTION

1. Field of the Invention

The present invention relates to an alignment method suitable for establishing alignment between each of a plurality of shot areas defined on a photosensitized substrate and a mask pattern to be printed on each of the shot areas in a lithographic process for fabrication of semiconductor devices, liquid crystal display devices, and others. The present invention also relates to an exposure apparatus for use in such an alignment method.

2. Related Background Art

In general, the fabrication of typical semiconductor devices involves the formation of multilayer circuit patterns on a semiconductor wafer (simply referred to as "wafer" hereinafter). This requires that the registration between circuit patterns of related layers (such as two adjacent layers) on the wafer should be within a specified tolerance in order to ensure that the fabricated semiconductor devices meet design requirements. As semiconductor devices have developed to have a greater and greater number of components per IC chip, leading to LSIs (large-scale-integrated circuits) and then to VLSIs (verylarge-scale-integrated circuits), the registration accuracy required by the lithographic process involved in the fabrication of semiconductor devices has become more and more stringent.

In the lithographic process for fabricating IC chips, there have been widely used step-and-repeat type of projection exposure apparatuses (called "steppers"). Where the stepper is used, the exposure region of a wafer is divided into a number of shot areas, and a pattern formed on a reticle (or mask) is successively printed on the shot areas with the printed pattern aligned (or overlaid) with the previously defined patterns on the wafer. More recently, so-called step-and-scan type of projection exposure apparatuses have been developed in order to enable the exposure of a larger pattern formed on a larger reticle without necessitating the use of a projection optical system having a larger diameter. In the step-and-scan type of projection exposure apparatus, each shot area on the wafer is positioned at the scan starting position by a stepping operation, and then the reticle and the shot area are moved in synchronism with each other and relative to the projection optical system, during which exposure is performed, so that a scanning exposure is performed with respect to each shot area.

In these types of projection exposure apparatuses, a laser interferometer is used to perform precision measurement of the position of a wafer stage carrying a wafer. In addition, an optical alignment sensor is used to determine the position of an alignment mark (wafer marks) formed for each shot area on the wafer as, for example, a relief pattern. The position of the wafer stage is controlled based on the measured values from the laser interferometer as well as the determination results from the optical alignment sensor.

The types of projection exposure apparatuses described above can provide the registration accuracy required for the fabrication of semiconductor devices whose complexity corresponds to that of a typical 256-megabit DRAM (dynamic-random-access-memory) chip. However, it is anticipated that higher registration accuracy tolerating, for example, errors of less than 50 nm (nanometers) with a minimum width of ruling of 150 nm may be required in the future for the fabrication of semiconductor devices whose complexity corresponds to that of a possible 1-gigabit DRAM chip. In order to achieve this registration accuracy by using any of the existing types of projection exposure apparatuses, the measurement accuracy of the laser interferometer must be as high as that tolerating errors of less than several nanometers, and a system including the wafer stage must be sufficiently stable to prevent any significant variation in the relative position between the wafer and the moving mirror monitored by the laser interferometer. In addition to such a higher registration requirement, there is another requirement that high throughput (i.e., the number of wafers that can be processed per unit of time) be achieved. Unfortunately, it is difficult to meet both of these requirements with any of the existing alignment techniques.

In view of the foregoing, it is an object of the present invention to provide an alignment method which can achieve higher registration accuracy without any need for high stability in the position control of the stage used for positioning the photosensitized substrate nor any need for tight tolerance of the measurement means (such as a laser interferometer) used for measuring the position of the stage, and even when the positioning is performed at a higher speed.

It is another object of the present invention to provide an exposure apparatus usable for performing such an alignment method.

SUMMARY OF THE INVENTION

In accordance with one aspect of the present invention, there is provided an alignment method for establishing alignment between each of a plurality of shot areas on a substrate and a corresponding mask pattern when an image of the corresponding mask pattern is to be printed by exposure onto each of the plurality of shot areas, comprising the steps of: forming on the substrate a regular pattern comprising a plurality of pattern elements regularly distributed over the plurality of shot areas; and performing an alignment operation based on the position of the regular pattern so as to establish alignment between each of the plurality of shot areas and the corresponding mask pattern.

In such alignment method, it is preferable that the regular pattern comprises one of layers of circuit patterns to be formed on the substrate.

Further, the alignment method may further comprise the steps of: removing a part of the regular pattern formed on the substrate; and performing the alignment operation based on the position of a remaining part of the regular pattern.

Moreover, the position of the regular pattern may be detected by performing the steps of: illuminating the regular pattern with a plurality of light beams from different directions, the plurality of light beams being coherent with each other; and detecting the phase of an interference beam including a plurality of diffracted light beams emitted from the regular pattern in the same direction.

In accordance with another aspect of the present invention, there is provided an exposure apparatus, comprising: a light source for emitting a primary light beam; a beam-splitting optical system for splitting the primary light beam into a plurality of secondary light beams which are coherent with each other; and an objective optical system for modifying each of the plurality of secondary light beams into a substantially plane wave light beam, and for illuminating a region of a photosensitive-material-coated substrate with the secondary light beams at different incident angles, the region of the substrate extending over a plurality of shot areas defined on the substrate; wherein the region of the substrate extending over the plurality of shot areas is exposed to a regular pattern of light of interference fringes produced on the substrate by the plurality of secondary light beams.

In such an exposure apparatus, it is preferable that the beam-splitting optical system produces first and second pairs of the secondary light beams; the objective optical system irradiates the first pair of secondary light beams onto the substrate symmetrically along a predetermined first direction and irradiates the second pair of secondary light beams onto the substrate symmetrically along a second direction traversing the first direction; and the exposure apparatus further comprises interference fringes modification means for changing at least one of the pitch of the interference fringes and the duty ratios thereof.

According to the alignment method of the present invention, when performing alignment between each of a plurality of shot areas on a substrate to be exposed and a corresponding mask pattern, the alignment operation is performed by making position control so as to maintain a desired relationship between the positions of a regular pattern formed on the substrate and a corresponding pattern, such as a regular pattern, formed on the mask. Therefore, high measurement accuracy is not required by the position measurement means (such as a laser interferometer) for measuring the position of the stage which moves the substrate. Further, where a laser interferometer is used, no rigid tolerance is imposed with respect to stability in the distance between the moving mirrors fixed on the stage for measurement and the laser interferometer disposed externally of the stage.

According to the exposure apparatus of the present invention, the primary light beam, such as a laser beam, is split into a plurality of secondary light beams. The secondary light beams produce a pattern of light of interference fringes, to which the photosensitive material on the substrate is exposed. Therefore, by performing development and other associated processes of the exposed substrate, a regular pattern, such as a two-dimensionally regular pattern, is formed on the substrate.

BRIEF DESCRIPTION OF THE DRAWINGS

The above and other objects, features, and advantages of the present invention will become apparent from the following description when taken in conjunction with the accompanying drawings in which.

DETAILED DESCRIPTION OF PREFERRED EMBODIMENTS

Referring now to the accompanying drawings, a preferred embodiment of the alignment method according to the present invention will be described in detail. According to the embodiment, a two-dimensional regular pattern is formed on a wafer, or photosensitized substrate, for the alignment purpose. The regular pattern suitable for this purpose may be formed by repetitively printing a predetermined pattern formed on a reticle onto the wafer to form a two-dimensional array of printed patterns having predetermined pitches in two directions by using a stepper or a step-and-scan type of projection exposure apparatus.

Alternatively, the regular pattern suitable for this purpose may be formed by exposing the wafer to interference fringes produced by light beams. Therefore, in the following, first of all described is an embodiment of the exposure apparatus which may be suitably used for forming a two-dimensional regular pattern on a wafer. The exposure apparatus is capable of forming of a continuous, two-dimensional periodic pattern on a photoresist layer applied on a wafer, and the pattern is formed in a region having a broad extent extending over a plurality shot areas defined by a projection exposure apparatus for printing circuit patterns, such as a stepper or a step-and-scan type of projection exposure apparatus.

Figure 1:
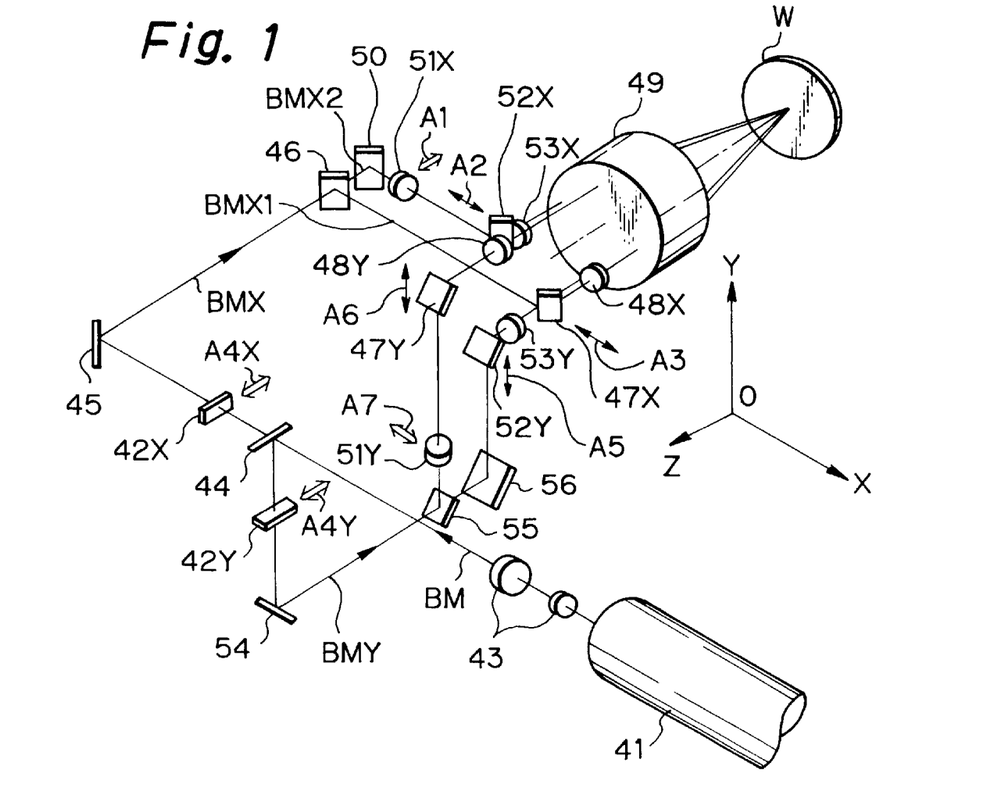
FIG. 1 is a perspective view of an embodiment of the exposure apparatus according to the present invention, which may be suitably used for an embodiment of the alignment method of the present invention.

FIG. 1 shows a schematic of the exposure apparatus for forming a periodic pattern by utilizing interference fringes. As shown in FIG. 1, the exposure apparatus has a laser source 41 for emitting a coherent laser beam BM. The laser beam BM from the laser source 41 is expanded in its cross section by a beam expander 43. Then, the laser beam BM is split by a beam splitter 44 into two laser beams, one being referred to as the X-axis laser beam BMX and the other as the Y-axis laser beam BMY. The laser source 41 may be an Ar-ion (argon-ion) laser, an He-Cd (helium-cadmium) laser, a harmonic generator of YAG laser or others. It is desirable that the laser source 41 is capable of emitting as a highly coherent light beam as possible and has a good temporal stability in its output power. Further, it is desirable for the wavelength of the laser beam BM to lie in the ultraviolet range so that the photoresist which is coated on the wafer W may have a high sensitivity to the laser beam BM.

There are provided shutters 42X and 42Y for selectively cutting off the split laser beams BMX and BMY, respectively, which shutters are driven in directions A4X and A4Y, respectively, each perpendicular to the beam axis of the associated laser beam. One of the laser beams, BMX, is reflected by a mirror 45 and then split again by a beam splitter 46 into two laser beams BMX1 and BMX2.

The shutters 42X and 42Y allow the laser beams BMX and BMY to pass therethrough when exposure is to be made, while otherwise cut off the laser beams, so as to control exposure as well as protect the operator against any injury by the laser beams.

Figure 3:
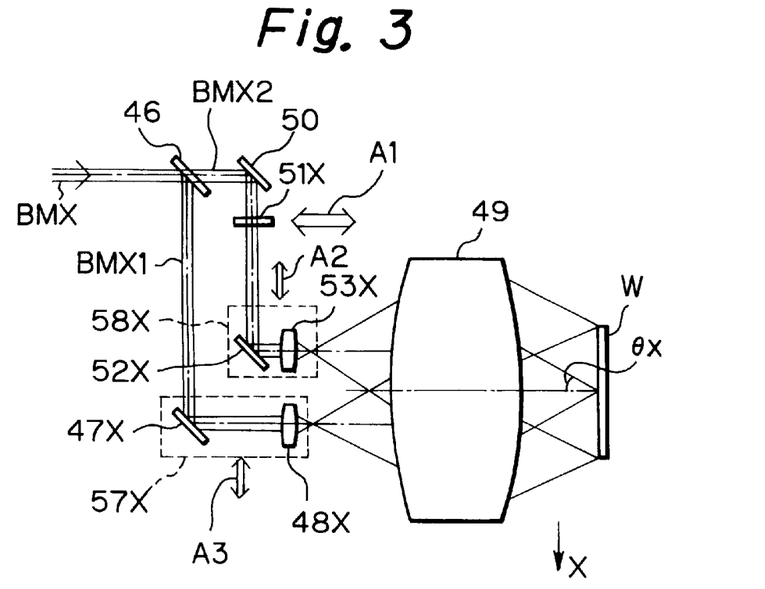
FIG. 3 is a cross sectional view of a part of the exposure apparatus of FIG. 1, along the plane including the optical axes of the condenser lenses 48x and 53x.

FIG. 3 is a cross sectional view along the plane determined by the beam axes of the two laser beams BMX1 and BMX2 shown in FIG. 1. In FIG. 3, the first of the two laser beams, BMX1, is reflected by a mirror 47X and then collected by a condenser lens 48X and is incident to a projection lens 49. Similarly, the second of the two laser beams, BMX2, is successively reflected by mirrors 50 and 52X. The second laser beam is then collected by a condenser lens 53X and is incident to the projection lens 49. There is disposed between the mirrors 50 and 52X a variable attenuator 51X which is driven in a direction A1 perpendicular to the beam axis of the laser beam BMX2. The attenuator 51X is capable of continuously diminishing the intensity of the laser beam BMX2 so as to control an amount of the exposure of the wafer W to the interference fringes projected on the wafer W and spreading in the X-direction.

The condenser lenses 48X and 53X collect the laser beams BM1 and BM2, respectively, at points which lie in the front side focal plane of the projection lens 49. The two points are arranged apart from the optical axis of the projection lens 49 by the same distance and in the opposite directions. Therefore, the two laser beams BMX1 and BMX2 collected by the condenser lenses 48X and 53X, respectively, make plane wave laser beams after having passed through the projection lens 49, and these plane wave laser beams are incident on the photoresist-coated wafer W in different directions, so that interference fringes are produced on the wafer W. The spreading direction of the interference fringes (i.e., the direction in the pitch thereof) is parallel to the surface of the wafer W as well as to the surface of the drawing sheet of FIG. 3 (this direction is the X-direction or the direction of the X-axis). The pitch dx of the interference fringes in the direction parallel to the X-axis (the X-direction) is expressed as $$dx = \lambda/(2\sin \theta x) \qquad (1)$$

where $\lambda$ represents the common wavelength of the plane wave laser beams BMX1 and BMX2, and ex represents the angle formed between the optical axis of the projection lens 49 and the propagation direction of the two plane wave laser beams.

The condenser lens 53X and the mirror 52X are formed as a single unit or movable block 58X, and the movable block 58X is supported for fine adjustment of its position in a direction A2 perpendicular to the optical axis of the projection lens 49 and parallel to the X-axis. Similarly, the condenser lens 48X and the mirror 57X are formed as a single unit or movable block 57X, and the movable block 57X is supported for fine adjustment of its position in a direction A3 perpendicular to the optical axis of the projection lens 49 and parallel to the X-axis. The fine adjustment of the positions of the movable blocks 57X and 58X is controlled such that the distance between the optical axis of the projection lens 49 and the optical axis of the movable block 57X and that between the optical axis of the projection lens 49 and the optical axis of the other movable block 58X are kept equal to each other. By shifting the movable blocks 57X and 58x, the angle ex of the two plane wave laser beams in the X-direction relative to the optical axis of the projection lens 49 may be controlled, which enables the adjustment of the pitch dx of the interference fringes to a desired value according to formula (1) above.

Figure 4:
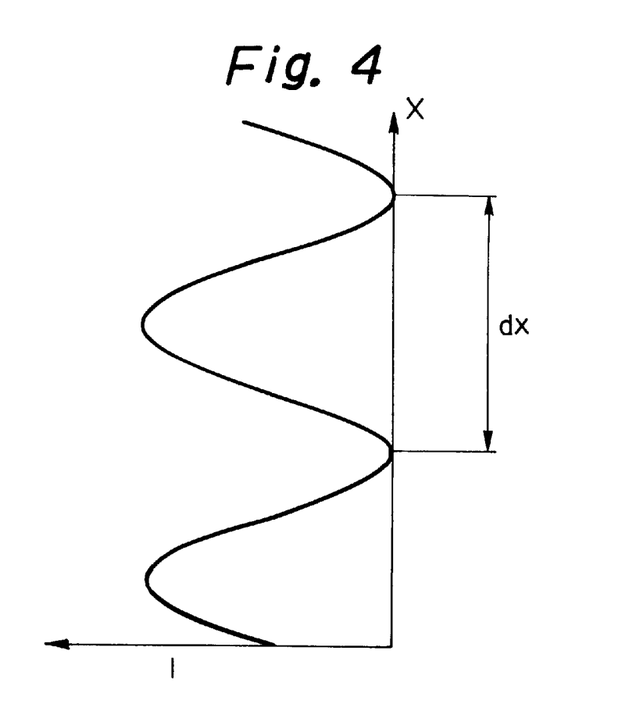
FIG. 4 is a graph showing an exemplified light intensity distribution in the X-direction of the interference fringes produced on the wafer by the exposure apparatus of FIG. 1.

FIG. 4 is a graph showing the light intensity distribution in the X-direction of the interference fringes produced on the wafer W. As seen from this figure, the intensity I of the interference fringes varies substantially sinusoidally with a pitch dx.

Referring again to FIG. 1, the Z-direction is provided to be parallel to the optical axis of the projection lens 49, and the Y-direction is provided to be perpendicular to both the Z-direction and the X-direction which is defined above with reference to FIG. 3. The Y-axis laser beam BMY, as generated by splitting the laser beam BM by means of the beam splitter 44, is reflected by a mirror 54 and again split by a beam splitter 55 into two laser beams. One of the two laser beams is reflected by a mirror 47Y, before it is collected by a condenser lens 48Y and is incident to the projection lens 49. The other laser beam is successively reflected by mirrors 56 and 52Y, before it is collected by a condenser lens 53Y and is incident to the projection lens 49. The condenser lenses 48Y and 53Y occupy the respective positions which are apart from each other in the Y-direction and symmetrical with respect to the optical axis of the projection lens 49.

By virtue of this arrangement, similarly to the above described X-direction spreading interference fringes, the laser beams emitted from the condenser lenses 48Y and 53Y pass through the projection lens 49 so as to produce interference fringes spreading in the Y-direction with a pitch dy. The mirror 47Y and the condenser lens 48Y are included in a movable block (not shown) to form a single unit, while the mirror 52Y and the condenser lens 53Y are included in another movable block (not shown) to form another single unit. These movable blocks are supported for movements in the Y-direction so as to occupy the respective positions which are symmetrical with respect to the optical axis of the projection lens 49, as represented by the arrows A6 and A5, respectively. By shifting these movable block the pitch dy of the Y-direction spreading interference fringes may be adjusted. Further, there is disposed between the beam splitter 55 and the mirror 47Y an adjustable attenuator 51Y which is movable in a direction A7 perpendicular to the axis of the associated laser beam, so that the quantity of light of the laser beam may be diminished by the adjustable attenuator 51Y. This enables an amount of the exposure of the wafer by the Y-direction spreading interference fringes to be adjusted.

Figure 2:
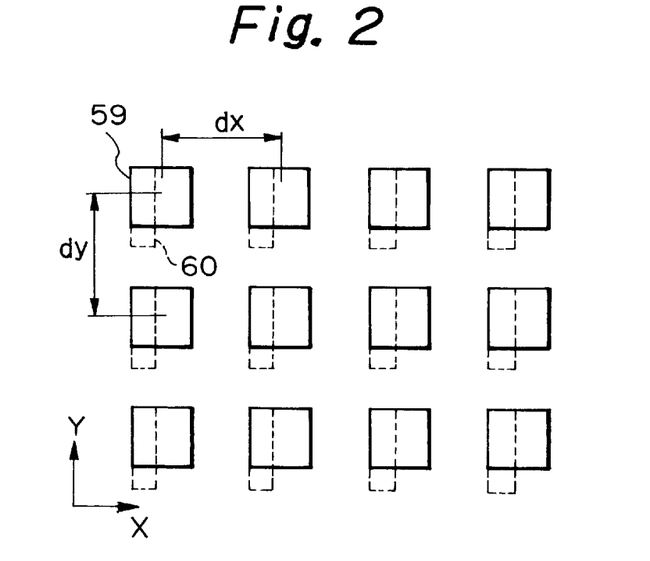
FIG. 2 is an enlarged plan view of a portion of the surface of a wafer showing an exemplified periodic pattern formed on the wafer by exposing the wafer to the interference fringes produced by the exposure apparatus of FIG. 1 and subsequently developing the image of the interference fringes.

The net result is that the exposure apparatus of FIG. 1 can project a two-dimensional periodic pattern of interference fringes on the wafer W. The wafer W is coated with photoresist which is high in a value of $\gamma$. After exposure of the photoresist-coated wafer W to the interference fringes and the following development process, a grating-shaped resist pattern 59 comprising a plurality of fine rectangular features or resist elements arrayed in a two-dimensional array, with a pitch dx in the X-direction and a pitch dy in the Y-direction, is formed on the wafer W as shown in FIG. 2.

The pitches dx and dy in the X- and Y-directions may be set to any desired values by adjusting the movable blocks in the exposure apparatus of FIG. 1 to their appropriate positions. The size of each the elements of the resist pattern 59 may be controlled to any desired size by regulating the open time of each of the shutters 42X and 42Y so as to control the exposure of the wafer W by the associated laser beams to the appropriate amount. Further, the aspect ratio of each the elements of the resist pattern may be changed so as to form, for example, elongated features or elements 60 such as represented by broken lines in FIG. 2. This can be achieved by adjusting the diminutions by the shutters 42X and 42Y independently from each other, so as to independently change the exposure by the X-direction spreading interference fringes and that by the Y-direction spreading interference fringes.

According to the alignment method of the present embodiment, in addition to the formation of the two-dimensional periodic pattern on a wafer, the transfer of a pattern formed on a reticle onto each shot area on the wafer is performed by using a projection exposure apparatus, such as an apparatus of the step-and-scan type. The projection exposure apparatus comprises an alignment system of an interference type by using two light beams. In the following, an exemplified projection exposure apparatus in which the alignment method of the present embodiment is incorporated will be described with reference to FIGS. 5 and 6.

Figure 5:
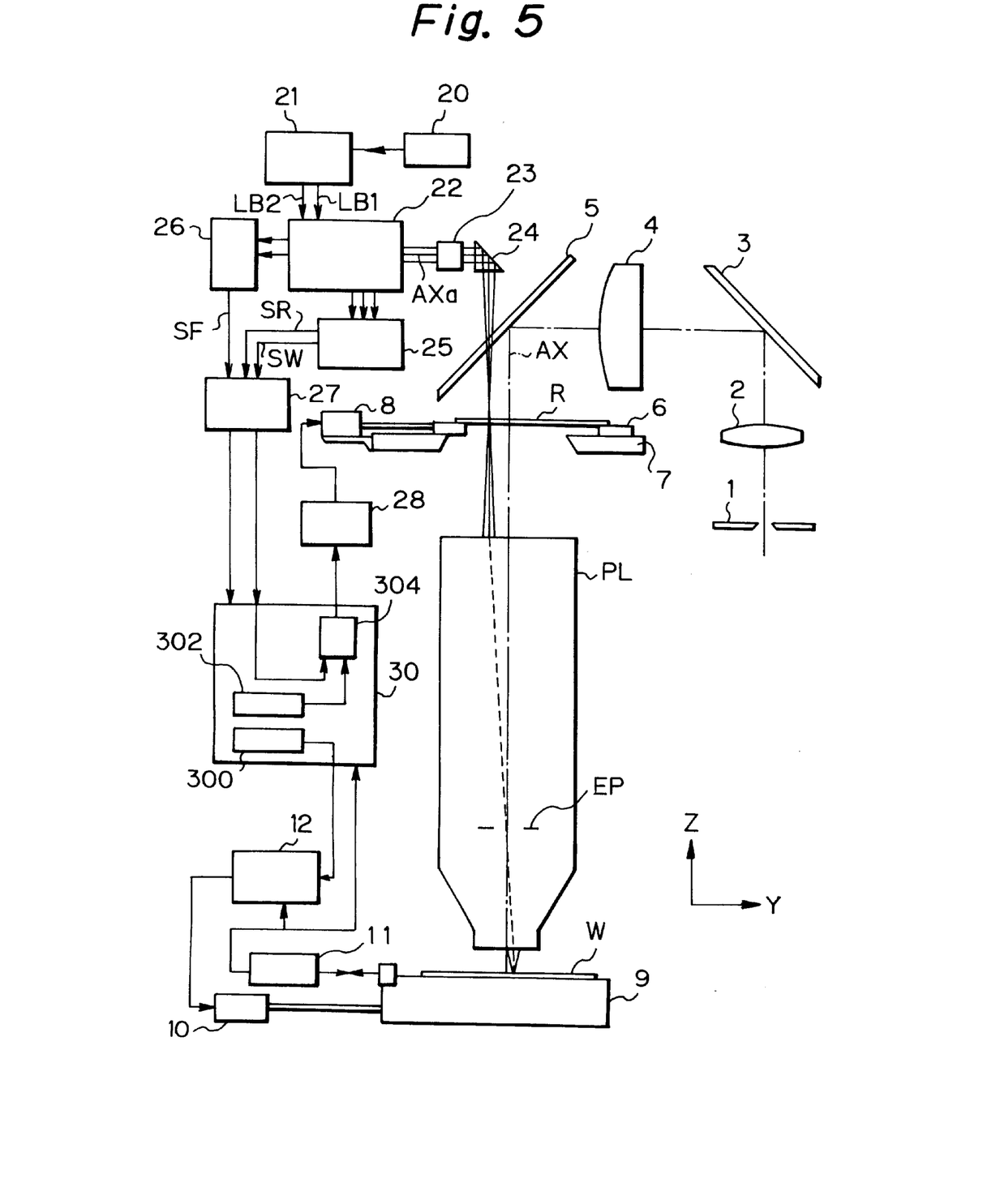
FIG. 5 is a schematic view showing a main part of a step-and-scan type of projection exposure apparatus used for an embodiment of the alignment method of the present invention.

FIG. 5 shows a schematic of the exemplified projection exposure apparatus incorporating the alignment method of the present embodiment. The projection exposure apparatus comprises an exposure light source (not shown) for emitting an illumination light beam for exposure. The light beam is modified by, for example, a fly-eye lens to have a uniform illuminance distribution and illuminates a reticle blind 1 which serves as an illumination field stop. The reticle blind 1 has a slit or elongate aperture formed therein, which extends in the direction normal to the surface of the drawing sheet of FIG. 5.

The illumination light beam, having passed the slit of the reticle blind 1, passes through a lens system 2, a mirror 3, a condenser lens 4, and a dichroic mirror (or beam splitter) 5, and reaches a reticle R. The reticle blind 1 lies in the plane which is conjugate to the plane of the pattern bearing surface of the reticle R (which is the surface facing to a projection optical system PL) with respect to the combined optical system composed of the lens system 2 and the condenser lens 4, so that the illumination light beam illuminates only a slit-shaped illumination field on the pattern bearing surface of the reticle R. The center of the slit-shaped illumination field is coincident with the optical axis AX of the projection optical system PL and the illumination optical system (including the lens system 2 and the condenser lens 4). Here, we define the Z-direction as the direction parallel to the optical axis AX in the projection optical system PL, the X-direction as the direction normal to the surface of the drawing sheet of FIG. 5, and the Y-direction as the direction perpendicular to both the Z- and X-directions. The Y-direction is the scanning direction.

Figure 6:
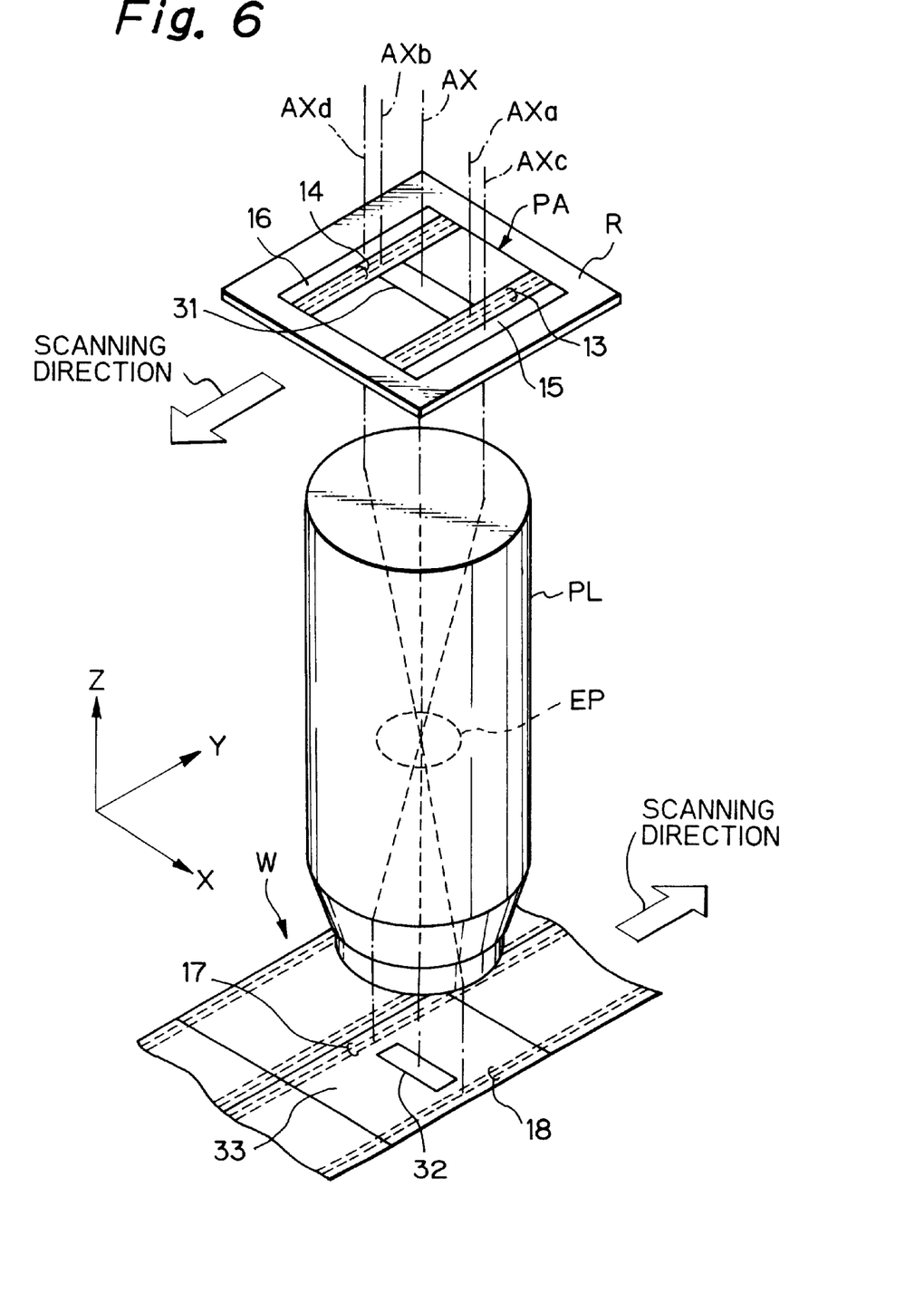
FIG. 6 is a perspective view of a part of the projection exposure apparatus of FIG. 5 illustrating the embodiment of the alignment method of the invention as performed during exposure process for printing a reticle pattern onto a wafer using scanning exposure technique.

The reticle R is fixedly held on a reticle stage 6 by suction. The reticle stage 6 is movable in various directions, and movable with a substantially long stroke at least in the Y-direction. Specifically, the reticle stage 6 can be moved along columns 7 at a constant velocity for scanning, by means of a drive motor unit 8. Apparently, in order to complete the alignment of the reticle R, appropriate mechanisms are required and in fact provided for the minute movements in the X-direction as well as in the rotational direction (e-direction) of the reticle stage 6; however, such mechanisms are well known in the art and thus are not shown nor described in more detail here. As shown in FIG. 6, the image of that part of the pattern on the reticle R which is then in the slit-shaped illumination field 31 is projected through the projection optical system PL onto the wafer W within the slit-shaped exposure field 32 of the shot areas 33 on the wafer W.

The projection optical system PL may be, for example, a projection lens. An example of such projection lens is of the full-field type with a demagnification ratio of 1:5, is composed of only refraction optical elements (i.e., refraction lens elements), and is telecentric at both of its reticle side and its wafer side. During the scanning exposure process, the reticle R is driven to move in -Y-direction (or +Y-direction) relative to the illumination field 31 while the wafer W is driven to move in synchronism therewith in +Y-direction (or in -Y-direction) relative to the exposure field 33, through which the image of the pattern on the reticle is sequentially printed onto each shot area 33 on the wafer W.

Referring again to FIG. 5, the wafer W is rested on a wafer stage 9 which is two-dimensionally movable (i.e., movable in the X- and Y-directions) with a substantially long stroke in either of the directions. The wafer stage 9 is driven by a drive motor unit 10 for such movements. The change in the position of the wafer stage 9 is continuously measured by a laser interferometer 11. The laser interferometer 11 also serves to measure the velocities in the X- and Y-directions of the wafer stage 9 and supplies the measured values for the coordinates and the velocities to a drive control unit 12. The drive control unit 12 controls the drive motor unit 10 according to an optimal control sequence based on the position and velocity information from the laser interferometer 11. In the shown projection exposure apparatus, the wafer stage 9 is moved in the Y-direction for scanning in the exposure operation, while moved in the X-direction for stepping operation. However, it is apparent that the moving directions for these operations are interchangeable if the moving direction of the reticle stage is changed accordingly.

Though not shown in FIG. 5, another laser interferometer is provided for the reticle stage 6, serving to measure various parameters associated with the reticle stage 6 including its position in the two-dimensional coordinate system, its rotational error (yawing) and others.

Referring next to FIG. 6, we will describe the exemplified arrangements of the alignment mark formed on the reticle R (referred to as the "reticle mark" hereinafter) and the alignment mark formed on the wafer W (referred to as the "wafer mark" hereinafter). As shown in FIG. 6, the reticle R and the wafer W are driven to move in opposite directions along the Y-direction for scanning. Because the movements for scanning are made in the Y-direction, the reticle R has a pair grating marks 13 and 14 which occupy the respective, continuous stripe-shaped, mark formation regions extending in the Y-direction (i.e., the scanning direction) along opposite sides of the pattern area PA defined on the reticle R, each of the grating marks 13 and 14 having periodicity in two different directions. Further, the reticle R has a pair of stripe-shaped transparent windows 15 and 16 defined therein and extending in the Y-direction adjacent and outside the respective grating marks 13 and 14. Each of the grating marks 13 and 14 has a two-dimensional grating pattern composed of fine features or grating elements arrayed in rows and columns extending in the X- and Y- directions, respectively, with a predetermined pitch in each of the directions. Although the grating marks 13 and 14 are widely separated from each other and the pattern area PA is provided between the grating marks 13 and 14, each row of grating elements of one grating mark 13 has corresponding row of grating elements of the other grating mark 14 at the same position in the Y-direction, that is, the grating marks 13 and 14 are "in phase" in the Y-direction.

On the other hand, the wafer W, on which the shown projection exposure apparatus works, has its surface divided into a plurality of shot areas 33. Each shot area 33 has a pair grating marks 17 and 18 which occupy the respective, continuous stripe-shaped, mark formation regions extending in the scanning direction along opposite sides of the shot area. One grating mark 17 on the wafer W occupies one region corresponding to one transparent window 15 of the reticle R and has appearance similar to the image of one grating mark 13 on the reticle R. The other grating mark 18 on the wafer W occupies the other region corresponding to the other transparent window 16 of the reticle R and has appearance similar to the image of the other grating mark 14 on the reticle R.

The positions in the two-dimensional coordinate system (i.e. the positions in the X- and Y-directions) of the grating marks 13 and 14 on the reticle R are determined by a pair of alignment optical systems having optical axes AXa and AXb, respectively. The positions in the two-dimensional coordinate system of the grating marks 17 and 18 on the wafer W are determined by another pair of alignment optical systems having optical axes AXc and AXd, respectively. The results of the determination of the positions are used, in turn, to determine any error (or positional deviation) in alignment in terms of the two-dimensional coordinate system between the grating marks 13 and 17, and that between the grating marks 14 and 18, continuously during the scanning exposure operation. Further, during the scanning exposure operation, fine adjustment of the position of the reticle R and/or the position of the wafer W is performed so as to keep alignment errors within a predetermined tolerance. The optical axes AXa and AXb as well as the optical Axes AXc and AXd cross over the optical axis AX of the projection optical system PL at the center of the pupil plane EP (this is a Fourier transform plane with respect to the reticle R).

Referring again to FIG. 5, the alignment system and the control system used in the projection exposure apparatus shown therein will be explained. The alignment system used in the projection exposure apparatus is of the so-called double beam LIA (Laser Interferometric Alignment) type. Examples of the LIA type of alignment system are detailed, for example, in Published Japanese Patent Application Nos. Sho-63-283129 (1988) and Hei-2-227602 (1990). Thus, presented here is only a brief description of the alignment system used.

As shown in FIG. 5, there is shown a laser source 20 which may be an He-Ne laser, an He-Cd laser, an Ar-ion laser, a semiconductor laser, or others. The laser source 20 emits a coherent, linearly polarized laser beam which enters a frequency shifter unit 21 serving to generate two laser beams from the received laser beam. Specifically, the frequency shifter unit 21 generates two laser beams LB1 and LB2 which have a frequency difference $\Delta f$ between them. The frequency difference $\Delta f$ should be lower than 100 kHz and preferably about 50 kHz if a semiconductor sensor such as a photodiode is used as a photodetector for receiving the interference light from the alignment marks. Alternatively, if a photomultiplier is used as the photodetector, the frequency difference $\Delta f$ may be chosen to be a relatively high frequency.

The two laser beams LB1 and LB2 enter a send-receive-separator optical system 22 which distributes each of the beams LB1 and LB2 into the four alignment optical systems mentioned above. FIG. 5 shows only one of the four alignment optical systems, which comprises an objective lens 23 and a downwardly directing reflecting mirror 24. The optical axis of the objective lens 23 is substantially aligned with, for instance, the optical axis AXc which is one of the four optical axes AXa, AXb, AXc and AXd shown in FIG. 6. The distributed laser beams LB1 and LB2 enter the objective lens 23 at the points which are off and symmetrical with respect to the optical axis of the objective lens 23. Having passed through the object lens 23, the laser beams LB1 and LB2 are reflected by the downwardly directing reflecting mirror 24 to pass through the dichroic mirror 5 and then pass one transparent window 15 (see FIG. 6) defined in the reticle R. When passing the transparent window 15, the two laser beams LB1 and LB2 have been collimated and will cross over each other. Having passed the transparent window 15, the two laser beams LB1 and LB2 further pass through the projection optical system PL and impinge upon one grating mark 17 on the wafer W with a predetermined angle formed between the incident directions of the laser beams, that is, the two laser beams LB1 and LB2 cross on the grating mark 17 on the wafer W.

The projection optical system PL has been corrected for those various aberrations which would otherwise occur with respect to the exposure light beam. However, with respect to the laser beams LB1 and LB2, the projection optical system PL may not be sufficiently corrected for aberrations and in fact there may remain a longitudinal chromatic aberration. In such a case, a light beam path deflecting element (such as a phase diffraction grating, a prism, etc.) may be disposed in a position along the light paths of the laser beams LB1 and LBw and in the pupil plane EP of the projection optical system PL, so that the laser beams LB1 and LB2 having passed through the projection optical system PL may cross each other in the Y-direction just on the grating mark 17 on the wafer W.

By virtue of the crossing of the laser beams LB1 and LB2 each other on the grating mark 17, there are produced on the grating mark 17 one-dimensional interference fringes spreading in the measuring direction or the Y-direction (i.e., comprising stripes each extending in the X-direction and spaced apart from the next stripe in the Y-direction). Since the two laser beams LB1 and LB2 (send beams) have the frequency difference $\Delta f$ between them, the interference fringes are continuously running in the measuring direction (i.e., the spreading direction) at a velocity proportional to the frequency difference $\Delta f$. The crossing angle of the laser beams LB1 and LB2 is selected such that the pitch between the grating elements of the grating mark 17 in the Y-direction and the pitch of the interference fringes in the Y-direction will suffice a certain relationship therebetween, which allows one of the orders (say, the +1 order) of diffraction of one laser beam LB1 and one of the orders (say, the −1 order) of diffraction of the other laser beam LB2 to be emitted from the grating mark 17 in parallel to each other and in the direction normal to the surface of the wafer W.

The diffracted light beams constitute together a beating-interference beam having a beating frequency equal to the above mentioned frequency difference $\Delta f$. When the point on the grating mark 17 upon which the two laser beams LB1 and LB2 impinge when crossing each other is displaced relative to the grating mark 17 in the Y-direction or the scanning direction, there occurs a corresponding change in the phase of the beats of the beating-interference beam. Although the movement of the wafer W for scanning causes the Doppler effect which produces a corresponding shift in the frequency of the beating-interference beam depending on the velocity of the movement, the position in the Y-direction of the grating mark 17 can be determined by detecting the change in the phase of the electrical signal produced by the photoelectric conversion from the beating-interference beam.

As shown in FIG. 5, the beating-interference beam from the grating mark 17 shown in FIG. 6 passes through the projection optical system PL, the transparent window 15 of the reticle R, the dichroic mirror 5, the downwardly directing reflecting mirror 5, the objective lens 23, and the send-receive-separator optical system 22, and finally reaches a photodetector unit 25. The photodetector unit 25 produces an electrical, sinusoidal, detection signal SW from the beating-interference beam.

Similar to the above described pair of laser beams LB1 and LB2, the send-receive-separator optical system 22 also emits another pair of laser beams toward the grating mark 13 formed on the reticle R. These laser beams impinge upon the grating mark 13 in the Y-direction with a predetermined crossing angle formed between them. Then, a beating-interference beam having a beating frequency equal to the above mentioned frequency difference Δf (the actual beating frequency varies depending on the velocity of the movement of the reticle R for scanning) is produced on and emitted from the grating mark 13 and reach the photodetector unit 25 through the send-receive-separator optical system 22. The photodetector 25 produces an electrical, sinusoidal, detection signal SR from the beating-interference beam. Both detection signals SW and SR are supplied to a phase difference determination unit 27.

One of the detection signals, SW, is obtained by photoelectric conversion of the beating-interference beam emitted from the grating mark 17 on the wafer W in the Y-direction. The other of the detection signal, SR, is obtained by photoelectric conversion of the beating-interference beam emitted from the grating mark 13 on the reticle R in the Y-direction. When the reticle R and the wafer W are being moved relative to the projection optical system PL for scanning, the detection signal SW and SR are the signals representing the beats of the same frequency (which is not equal to Δf). While, when the grating mark 13 on the reticle R and the grating mark 17 on the wafer W are not in phase, so that they are shifted from each other in the Y-direction, the detection signals SR and SW have a phase difference ΔΦ1 between them. This phase difference ΔΦ1 is determined by the phase difference determination unit 27, which calculates the alignment error in the Y-direction corresponding to the determined phase difference. Generally, a detectable range of the phase difference is ±180 degrees, which corresponds to the range of the alignment error ±dy/2 or ±dy/4, where dy is the pitch between the grating elements of the grating mark 17 in the Y-direction. The calculated alignment error in Y-direction is supplied to a main control unit 30.

The send-receive separator optical system 22 also emits a pair of laser beams for determining the position in the X-direction of the grating mark 17 and a pair of laser beams for determining the position in the X-direction of the grating mark 13 on the reticle R (both grating marks are shown in FIG. 6). The phase difference determination unit 27 is supplied with a detection signal corresponding to the position in the X-direction of the grating mark 17 and a detection signal corresponding to the position in the X-direction of the grating mark 13. Further, the phase difference determination unit 27 supplies the main control unit 30 with the alignment errors in the X-direction of the grating marks 13 and 17.

Though not shown in FIG. 5, there is disposed above the reticle R another LIA type of alignment optical system for determining the two-dimensional alignment error between the other grating mark 18 on the wafer W and the other grating mark 14 on the reticle R (both shown in FIG. 6). The two-dimensional alignment error determined by the second alignment optical system is supplied to the main control unit 30 as well. The main control unit 30 is continuously producing correction values to a drive control unit 12 for the wafer stage 9 and/or a drive control unit 28 for the reticle stage 6 so as to keep the alignment errors within the predetermined tolerances.

In order to facilitate the maintenance of the alignment between the reticle and the wafer during the scanning exposure operation, the main control unit 30 used in the exemplified projection exposure apparatus comprises a first velocity and position control unit 300 serving to drive the wafer stage 9 at a controlled constant velocity, a second velocity and position control unit 302 serving to drive the reticle stage 6 at a controlled constant velocity, and a tracking scanning control unit 304 serving to correct the alignment error between the reticle R and the wafer W by modifying the movement of the reticle stage 6 and thus of the reticle R.

The velocity and position control units 300 and 302 are used not only for maintaining the alignment during the scanning operation but also for the independent positioning of the reticle (so-called reticle alignment) and the independent positioning of the wafer (so-called wafer global alignment, or so-called enhanced global alignment (EGA) in which the coordinates of the array of shot areas are determined by using a statistical calculative technique). In such cases, the control units 300 and 302 operate independently in respective conventional manners to achieve the respective purposes. In contrast, during the scanning exposure operation, the control units 300 and 302 operate together in a harmonizing operating manner so as to control the relative position and the relative velocity between the reticle stage 6 and the wafer stage 9.

In the exemplified projection exposure apparatus, the tracking scanning control unit 304 is additionally provided in the main control unit 30 so as to enable the selective use of the tracking control and the normal harmonizing control. In the tracking control, the drive control unit 28 for the reticle stage 6 is servo-controlled, and the drive control unit 12 for the wafer stage 9 is controlled simply to maintain a constant velocity of the wafer stage 9, so that the alignment errors (or positional deviations) sequentially generated from the phase difference determination unit 27 are kept within the predetermined tolerances. Apparently, a modification may be made to this control manner so that the reticle stage 6 is controlled for a constant velocity while the wafer stage 9 may be controlled by the tracking control technique.

Moreover, in the exemplified projection exposure apparatus, the two-dimensional alignment errors are determined with respect to two sets of the grating marks. Specifically, the two-dimensional alignment error between the grating marks 13 and 17 and that between the grating marks 14 and 18 are determined by the alignment optical systems having the optical axes AXa, AXb, AXc and AXd (all shown in FIG. 6). This enables the continuous determination of not only the translational two-dimensional alignment error between the reticle R and each shot area 33 on the wafer W but also the rotational alignment error between them during the scanning exposure operation.

The rotational alignment error has a tolerance specified, as with the translational alignment error, depending on the size of the pattern area PA on the reticle R, the size of each shot area 33 on the wafer W and/or the minimum line-width to be formed. If there is a possibility that a rotational alignment error beyond such a tolerance would be produced, it is desirable to provide necessary correction for the rotational alignment error on the realtime basis during scanning exposure operation by feeding back the rotational alignment error to the rotating mechanism for minutely rotating the reticle stage 6. In addition, it is preferable that the center of rotation of the rotating mechanism be coincident with the center of the image of the slit-shaped aperture of the reticle blind 1 projected on the reticle R and thus with the center of the slit-shaped illumination field 31.

Figure 7:
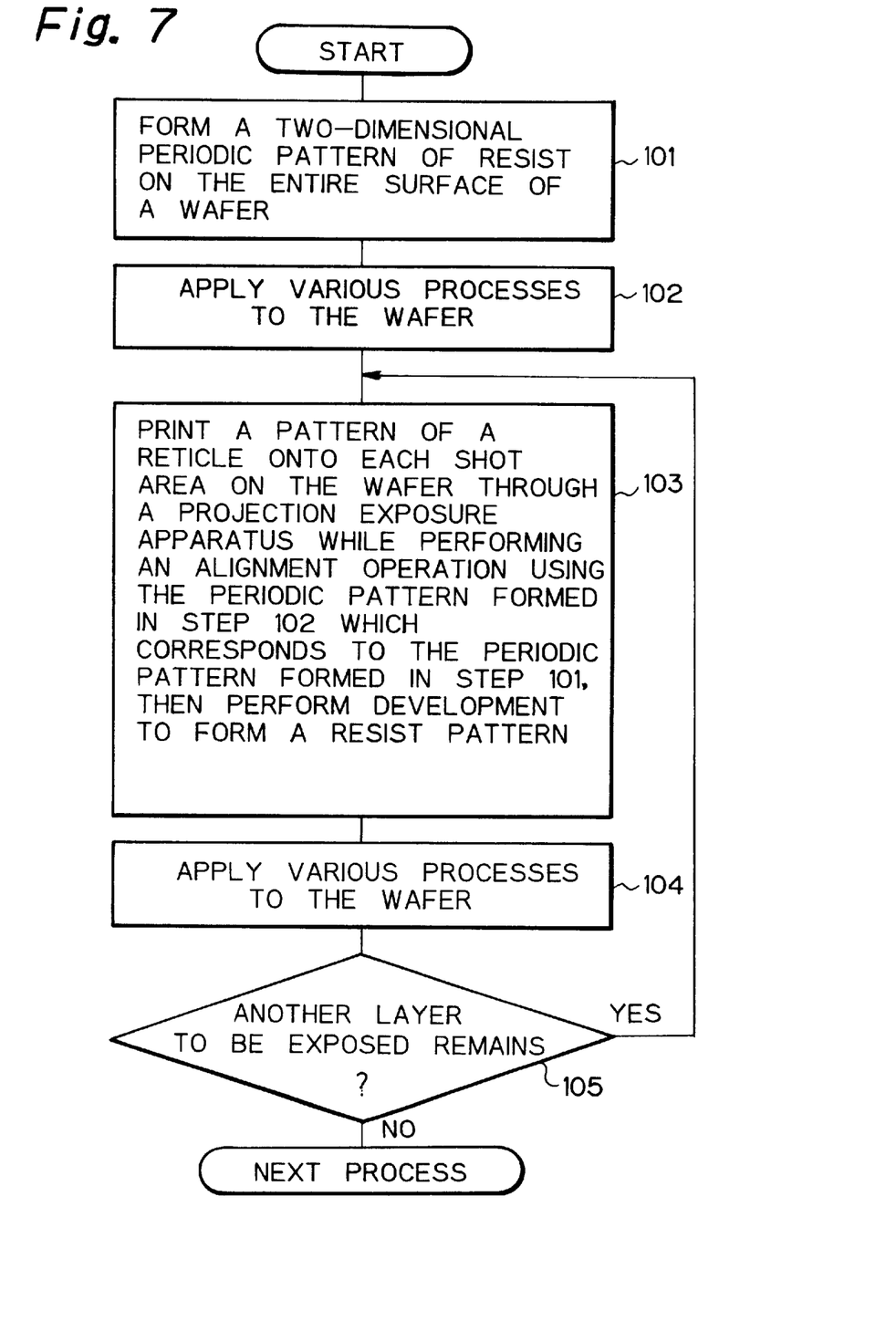
FIG. 7 is a flow chart showing a main part of a semiconductor device fabrication process utilizing the embodiment of the alignment method of the present invention.

Referring next to FIG. 7 showing a flowchart, as well as to FIGS. 8 and 9, an exemplified fabrication process for fabricating semiconductor devices by using the alignment method of the present embodiment will be described.

Figure 8:
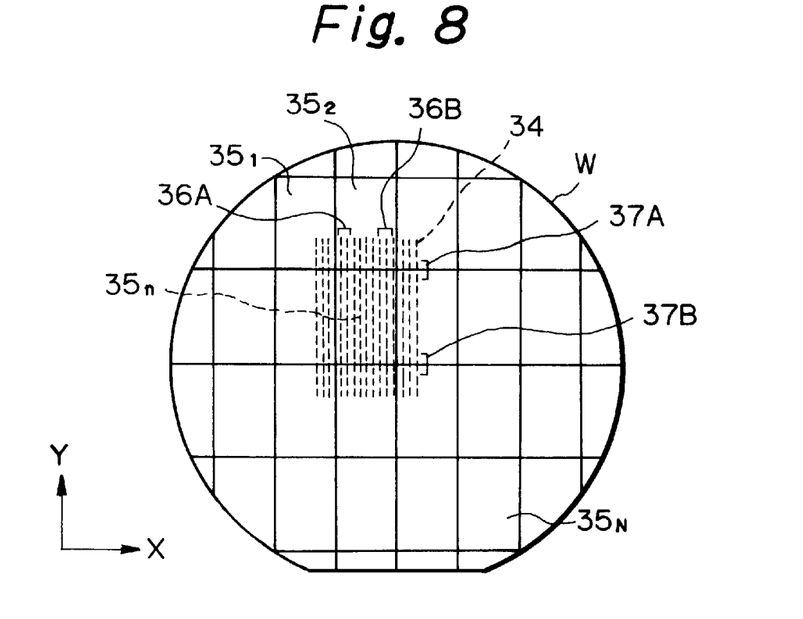
FIG. 8 is a plan view of a wafer showing another exemplified periodic pattern formed on the wafer when the embodiment of the alignment method of the present invention is performed.

Starting with step 101 in the flowchart of FIG. 7, a two-dimensionally regularly arranged periodic pattern of photoresist is formed as a resist pattern over the entire surface of a wafer as shown in FIG. 8. FIG. 8 shows an example of the periodic pattern, in which the surface of the wafer W is divided into N shot areas $35_1, 35_2, \ldots, 35_N$ (where N is the integer greater than one). The periodic pattern 34 of photoresist is formed over these shot areas, and comprises a resist pattern arranged in a two-dimensional array having a pitch dx in the X-direction and a pitch dy in the Y-direction.

Figure 9:
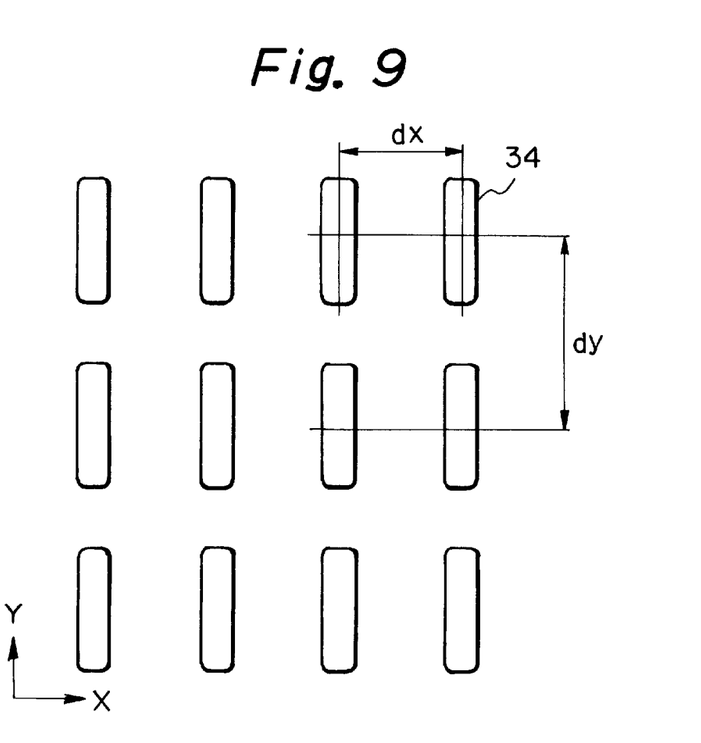
FIG. 9 is an enlarged plan view showing a portion of the-pattern shown in FIG. 8.

FIG. 9 shows an enlarged plan view of the wafer W showing the periodic pattern 34 of FIG. 8. The periodic pattern 34 comprises a plurality of fine features or resist elements which may be convex features, or alternatively concave features or pits. Each of the resist elements is in the form of an elongate rectangle with a width in the X-direction smaller than a half of the pitch dx in that direction and a length in the Y-direction nearly equal to the pitch dy in that direction. One of the methods of forming such a periodic pattern of photoresist (i.e., resist pattern) on the wafer W is to expose the entire photoresist layer on the surface of the wafer W to the interference fringes having two-dimensional periodicity by using the exposure apparatus of FIG. 1 and perform the associated development process. When this method is used, the periodic resist pattern 34 will occupy the whole surface of the wafer W including those regions directly on the borders between adjacent shot areas.

Another of the methods of forming a periodic resist pattern such as shown in FIG. 9 on the wafer W is to use a stepper or a step-and-repeat type of projection exposure apparatus such as shown in FIG. 5 so as to sequentially transfer a master pattern formed on a reticle (the master pattern corresponds to the periodic resist pattern to be printed such as shown in FIG. 9) onto the photoresist layer of every shot area on the wafer W, and perform the associated development process. When this method is used, the two-dimensional periodic pattern is transferred onto the surface of the wafer W except for those regions directly on the borders between adjacent shot areas which are defined by the stepper or the step-and-repeat projection exposure apparatus.

In the latter method, the reticle having the pattern for forming the periodic resist pattern on the wafer may be one of a plurality of reticles which are designed to be used for forming various circuit patterns on the substrate. For example, we may choose a reticle whose pattern is designed to form a resist pattern for an isolation structure for isolating adjacent transistors on a chip. In order to form an isolation structure on a chip, an isolation pattern of silicon oxide is formed on an isolation layer. Therefore, if the material of the pattern which is subsequently formed using the resist pattern for the alignment purpose is the same as that used for the isolation structure, the process including the step 101 can be a part of the process for forming the isolation structure, so that the step 101 will not add to the total number of steps. Further, no additional layer needs to be formed on the wafer for the alignment purpose.

Next in step 102, an etching process is performed using the resist pattern of FIG. 9, and then various subsequent processes, such as removal of the resist and oxidization of the surface of the wafer W, are performed. After these processes have been completed, the wafer W has a periodic pattern of silicon oxide, metal, or other material, which is identical in shape to the periodic resist pattern 34 of FIG. 9.

In the next step 103, an image of a pattern of a desired reticle R is sequentially printed by projection exposure onto the shot areas $35_1, 35_2, \ldots 35_N$ which have been defined on the wafer W as shown in FIG. 8. This projection exposure process is performed by using the step-and-scan type of projection exposure apparatus described above with reference to FIGS. 5 and 6. In addition, the alignment operation required for this projection exposure process is performed by using the periodic pattern, which has been formed on the wafer W through the process in step 102 and corresponds to the periodic resist pattern 34. For example, when the n-th shot area $35_n$ is exposed in this projection exposure process, those portions of the periodic pattern which are in the stripe-shaped regions 36A and 36B within the shot area 35, and along its opposite sides facing toward +X- and −X-directions, respectively, are used as the wafer marks.

The reticle R used for this projection exposure process has a pair of grating marks 13 and 14 formed thereon as shown in FIG. 6. The grating marks 17 and 18 on the wafer W shown in FIG. 6 correspond to the portions of the periodic pattern which are in the regions 36A and 36B. Further, the LIA alignment system shown in FIG. 5 is used to perform a continuous alignment operation during the scanning projection exposure of the shot area $35_n$ shown in FIG. 8 for printing thereon the image of the pattern of the reticle R.

The pitches dx and dy of the periodic pattern 34 formed in step 101 may lie in the range about 2 $\mu$m to 10 $\mu$m, for example. A typical LIA alignment system is capable of measuring a periodic pattern having such pitches with high accuracy allowing measurement errors of only less than about 5 nm.

In the alignment operation performed in step 103, the measurement of the initial position (i.e., the position just before the commencement of the scanning exposure of each shot area) of the wafer stage 9 carrying the wafer W does not require very high accuracy but may be performed with such accuracy as to allow measurement errors up to about 0.1 $\mu$m; such measurement errors may produce only alignment errors smaller than the pitch of the periodic pattern which has already been formed on the wafer W. Then, fine positioning of the wafer stage 9 is performed to correct such minute difference between the desired and the actual positions of the wafer stage 9 which is much smaller than the pitch of the periodic pattern, by using the LIA alignment system on the basis of information obtained from the measurement of the periodic pattern. Then, during the scanning exposure of each shot area, the alignment error between each grating mark on the reticle and the periodic pattern on the wafer is continuously measured by the LIA alignment system, and the movements of the reticle stage 6 and the wafer stage 9 are so controlled as to keep the alignment error within a predetermined tolerance. In this manner, the alignment error may be measured and corrected with high accuracy of several nanometers so as to allow only registration errors of less than 50 nm with the minimum ruling width of 150 nm.

In the alignment method according to the present embodiment, the two-dimensional position measurement is performed at two points on the periodical pattern on the wafer which points are spaced apart a certain distance, so that not only the translational alignment error but also the rotational alignment error can be determined. Further, by virtue of the two-point measurement at two points, any expansion or shrinkage of the pattern on the wafer W, as well as any error in the demagnification ratio associated with projection of the pattern can be recognized, and the projection exposure apparatus may be appropriately controlled based on the recognitions so that neither such expansion/ shrinkage nor the error in the demagnification ratio may cause any registration errors.

In the next step 104, the resist pattern formed on the wafer W through the process performed in step 103 is used as a mask, and the wafer W is treated with various processes including, for example, etching, ion implantation, deposition, and others, resulting in the formation of a circuit pattern on the wafer W, which circuit pattern corresponds to the resist pattern formed through the process performed in step 103.

In the succeeding step 105, it is determined whether there remains another layer to be exposed using the periodic pattern formed on the wafer W in step 102. If the determination is positive, the procedure returns to step 103 where another exposure process is performed for transferring the pattern of the corresponding reticle onto that layer. Otherwise, the procedure goes to the succeeding steps where other processes, such as the formation of a new wafer mark and the exposure process of a circuit pattern using that new wafer mark are performed.

In the above-described embodiment, the pattern which is transferred onto the wafer W in step 101 to form the pattern for the alignment purpose may be the pattern for forming an isolation structure for isolating adjacent elements on the chip, as described. Alternatively, the pattern for the alignment purpose may be the pattern for forming a gate and interconnection layer.

When a pattern for formation of an isolation structure is formed on the wafer W in step 101, and the formed pattern is used in the subsequent processes, we may often encounter the problem that there are those regions in each chip site where the design requirements for the semiconductor device such as LSI do not permit the isolation structure formation pattern being left under the subsequently formed structures. In such cases, the portions of the isolation structure formation pattern in such regions can be peeled off in a step performed after the isolation structure has been formed. However, it is preferable not to peel off the entire pattern but to leave those portions of the pattern (i.e., periodic pattern) which are in the regions along the peripheral edges of each chip site such as regions 36A, 36B, 37A and 37B of the shot area 35n shown in FIG. 8, because those portions of the periodic pattern left in the regions along the peripheral edges of each chip site may be used for alignment purposes. Further, it is desirable that any circuit patterns of semiconductor devices such as LSI which are printed in step 103 be designed to have the same pitch as the periodic pattern which have been formed through the processes performed in and prior to step 102, so that the printed pattern can be registered with the periodic pattern.

In the above described embodiment, the exposure process performed in step 103 in order to print a reticle pattern onto the wafer is performed by using the step-andscan projection exposure apparatus. Alternatively, this exposure process may be performed by using a stepper. When a stepper is used, the simplest way of establishing the alignment for each shot area is to measure the two-dimensional position of the periodic pattern at a single point on the wafer near that shot area. If the two-dimensional measurement is performed at two different points near that shot area, correction of the position for the rotational error of the shot area and of the expansion/shrinkage thereof may be achieved as well.

As mentioned above, the formation of the two-dimensional periodic pattern performed in step 101 may be achieved by using not only the exposure apparatus of FIG. 1 but also a stepper or a step-and-scan projection exposure apparatus. It is to be noted however that the use of a stepper or a step-and-scan projection exposure apparatus results in no transfer of the two-dimensional periodic pattern onto the regions directly on the borders between adjacent shot areas which are defined on the wafer W by the stepper or the step-and-scan projection exposure apparatus.

Because the periodic pattern is absent in those regions, the measured values from the laser interferometer which monitors the position of the wafer stage carrying the wafer are used for positioning the wafer during a transition from one shot area to another in the exposure process or transfer of the reticle pattern onto each shot area on the wafer performed in step 103. When the transition has been completed, the fine positioning is subsequently performed based on the results of the measurement of the two-dimensional periodic pattern formed on the wafer. Accordingly, while the position measurement by the laser interferometer is continuously operative, the fine position measurement performed using the two-dimensional periodic pattern becomes operative and then inoperative for each shot area. If a stepper is used to perform the exposure process in step 103, the desired alignment accuracy can be achieved by the fine position measurement performed using the two-dimensional periodic pattern.

However, if a step-and-scan projection exposure apparatus is used to perform the exposure process in step 103, we would encounter a problem relating to the alignment accuracy due to the interruptions of the periodic pattern on the borders between adjacent shot areas. Specifically, in the step-and-scan projection exposure technique, the reticle stage and the wafer stage have to be accelerated just before the commencement of the scanning exposure of each shot area. This acceleration is performed within the acceleration region associated with each shot area. Although the desired alignment accuracy has to be achieved during the acceleration by appropriate measurement and control, measurement using the two-dimensional periodic pattern is interrupted on the borders between adjacent shot areas so that the accuracy in measurement of the position of the wafer is deteriorated. Consequently, if a step-and-scan projection exposure apparatus is to be used to perform the exposure process in step 103, it is desirable that a continuous, noninterrupted periodic pattern extending over the entire surface of the wafer be formed in the process in step 101.

The present invention is applicable not only to the projection exposure methods and apparatuses using a light beam to project a pattern, but also to those using an electron beam, an ion beam or an X-ray beam for the purpose. Even in such cases, the alignment system to be incorporated in those projection exposure apparatuses has to be an optical system.

It is apparent that the present invention is not limited to the disclosed embodiment but may be embodied in various other forms and arrangements without departing the spirit of the present invention.

According to the alignment method of the present invention, the position of the regular pattern formed on the substrate is used as the reference for the final positioning, so that high registration accuracy may be advantageously achieved without any need for high stability in the position control of the stage used for positioning the substrate (i.e., photosensitized substrate) nor any need for tight tolerance of the measurement means (such as a laser interferometer) used for measuring the position of the stage. Further, by using the regular pattern as the reference for the positioning, higher registration accuracy than that obtainable by any of the existing alignment methods can be achieved even when the positioning is performed at a higher speed. Moreover, the pattern may be a continuous, two-dimensional regular pattern extending over a plurality of shot areas on the substrate.

In such a case, higher registration accuracy can be maintained even when a step-and-scan projection exposure apparatus is used to perform the exposure process, because the alignment operation can be performed continuously from the acceleration region.

Further, according to the present invention, the alignment operation is performed not using tiny alignment marks but using an extended regular pattern comprising many elements widely regularly distributed over a broad extent, so that there can be no problem caused by the misalignment between the circuit patterns and the alignment marks by the existing alignment methods.

Moreover, the regular pattern may be one of the layers of circuit patterns to be formed on the substrate. In that case, it is unnecessary to perform any additional steps of forming an additional pattern exclusively for alignment purpose, so that the whole fabrication process of the semiconductor device on the substrate will not become complicated.

In addition, a part of the regular pattern formed on the substrate may be removed, and the alignment operation may be performed based on the position of the remaining part of the regular pattern. In such a case, those portions of the regular pattern which would interfere with any of the subsequent processes can be removed.

Further, the position of the regular pattern may be detected by performing the steps of: illuminating the regular pattern with a plurality of light beams from different directions, the plurality light beams being coherent with each other; and detecting the phase of the interference beam composed of a plurality of diffracted light beams emitted from the regular pattern in the same direction. That is, the detection may be made by using a double beam interferometric type (LIA type) of alignment system. In such a case, the position of the regular pattern can be advantageously determined on the continuous measurement basis with high measurement accuracy allowing, for example, only measurement errors less than several nanometers.

According to the exposure apparatus of the present invention, a plurality of secondary light beams, each being a substantially plane wave light beam, illuminate a broad extent of a photosensitive-material-coated substrate (photosensitized substrate). The extent of illumination extends over a plurality of shot areas defined on the substrate. This manner of illumination produces interference fringes on the whole extent of illumination, so that an image of a regular pattern may be advantageously printed on the substrate over the broad extent of illumination by a single shot of exposure process. Then, the printed image of pattern is developed to form a regular pattern usable for the alignment method of the present invention.

Further, the exposure apparatus may include a beam-splitting optical system for generating first and second pairs of secondary light beams, the first pair of secondary light beams symmetrically illuminating the substrate along a predetermined first direction, the second pair of secondary light beams symmetrically illuminating the substrate along a second direction traversing the first direction, whereby the interference fringes have periodicity both in the first and second directions with respective pitches in these directions. The exposure apparatus may further include interference fringes modification means for altering at least one of the pitches and the duty ratios of the interference fringes. In such a case, the regular pattern formed on the substrate may advantageously be a two-dimensional regular pattern having pitches in two directions and the pitches and the duty ratios of the pattern is adjustable.

Although there have been shown and described several preferred embodiments of the present invention in detail, it should be understood that various changes, alterations and modifications may be made thereto and the present invention may be embodied in various other forms without departing from the spirit and the scope of the present invention as defined in the appended claims.

What is claimed is:

1. An alignment method for establishing alignment between each of a plurality of shot areas on a substrate and a corresponding mask pattern when an image of said corresponding mask pattern is to be printed by exposure onto each of said plurality of shot areas, comprising the steps of:

forming on said substrate a pattern comprising a plurality of pattern elements regularly and continuously distributed over each of said shot areas adjacent to each other and in a direction in which said substrate moves; and performing an alignment operation based on the position of said pattern so as to establish alignment between each of said plurality of shot areas and said corresponding mask pattern.

2. An alignment method as claimed in claim 1, wherein:

said pattern comprises one of layers of circuit patterns to be formed on said substrate.

3. An alignment method as claimed in claim 2, further comprising the steps of:

removing a part of said pattern formed on said substrate; and performing said alignment operation based on the position of a remaining part of said pattern.

4. An alignment method as claimed in any of claims 1, 2 and 3, wherein the position of said pattern may be detected by performing the steps of:

illuminating said pattern with a plurality of light beams from different directions, said plurality of light beams being coherent with each other; and detecting the phase of an interference beam including a plurality of diffracted light beams emitted from said pattern in the same direction.

5. An alignment method as claimed in claim 1, wherein said regular pattern is periodic in two-dimensions on said substrate.

6. An alignment method as claimed in claim 1, wherein said regularly and continuously distributed pattern elements are arranged in a plurality of lines extending in a direction substantially perpendicular to a direction in which said substrate moves.

7. An alignment method as claimed in claim 6, wherein said regularly and continuously distributed pattern elements are formed in a substantially entire surface of said substrate.

8. An exposure method for transferring a pattern of a mask onto a substrate having a plurality of shot areas thereon, comprising the steps of:

optically detecting positions of marks regularly and continuously formed over said plurality of shot areas; and performing alignment between each of said plurality of shot areas and said mask pattern on the basis of the detected positions of said marks to transfer said mask pattern onto said substrate.

9. An exposure method as claimed in claim 8, wherein said regular marks comprises one of layers of circuit patterns to be formed on said substrate.

10. An exposure method as claimed in claim 8, further comprising the steps of:

removing a part of said regular marks formed on said substrate; and performing alignment on the basis of the position of a remaining part of said regular marks.

11. An exposure method as claimed in claim 8, wherein the positions of said regular marks may be detected by performing the steps of:

illuminating said regular marks with a plurality of light beams from different directions, said plurality of light beams being coherent with each other; and detecting the phase of an interference beam including a plurality of diffracted light beams emitted from said regular marks in the same direction.

12. An exposure method as claimed in claim 8, wherein said regular marks are periodic in two-dimensions on said substrate.

13. An exposure method as claimed in claim 8, further comprising the steps of:

moving said mask and said substrate in synchronism; and performing alignment between said mask and said substrate during the relative motion between said mask and said substrate before said transferring step.

14. An exposure method as claimed in claim 8, wherein said mask has an alignment mark formed thereon, further comprising the step of detecting a position of said regular marks and a position of said alignment mark at the same time.

15. A exposure method as claimed in claim 8, wherein said regularly and continuously formed marks are arranged in a plurality of lines on said substrate.

16. A exposure method as claimed in claim 15, wherein said marks are formed in a substantially entire surface of said substrate.

17. A method for transferring a pattern of a mask onto a substrate to produce a semiconductor device, said substrate having a plurality of shot areas thereon, comprising the steps of:

optically detecting positions of marks regularly and continuously formed over each of said shot areas adjacent to each other and in a direction in which said substrate moves; and performing alignment between each of said plurality of shot areas and said mask pattern on the basis of the detected positions of said marks to transfer said mask pattern onto said substrate to produce said semiconductor device.

18. A device production method as claimed in claim 17, wherein said regular marks comprises one of layers of circuit patterns to be formed on said substrate.

19. A device production method as claimed in claim 17, further comprising the steps of:

removing a part of said regular marks formed on said substrate; and performing alignment on the basis of the position of a remaining part of said regular marks.

20. A device production method as claimed in claim 17, wherein said regularly and continuously formed marks are arranged in a plurality of lines extending in a direction substantially perpendicular to a direction in which said substrate moves.

21. A device production method as claimed in claim 20, wherein said marks are formed in a substantially entire surface of said substrate.

22. An exposure method for transferring a pattern image of a mask to a substrate comprising the steps of:

forming on said substrate at least two shot areas including a first shot area and a second shot area adjacent to each other;

transferring the pattern image of said mask to said first shot area;

starting to move said substrate for transferring the pattern image to said second shot area;

detecting marks formed on said substrate from when said substrate starts to move before starting to transfer the pattern image to said second shot area; and performing alignment between said substrate and said mask on the basis of the detecting step.

23. An exposure method as recited in claim 22, further comprising the step of synchronously moving said mask and said substrate to perform a scanning exposure to transfer the pattern image to said substrate.

24. An exposure method as recited in claim 22, wherein said marks formed on said substrate are regular marks continuously formed over said plurality of shot areas on said substrate.

25. An exposure method as recited in claim 24, wherein said regular marks are formed on said substrate in a direction in which said substrate moves.

26. An exposure method as recited in claim 24, wherein said continuously formed regular marks are arranged in a plurality of lines on said substrate.

27. An exposure method as recited in claim 26, wherein said regular marks are formed in a substantially entire surface of said substrate.

28. An exposure method as recited in claim 22, further comprising the step of applying an electromagnetic wave beam to said marks at the step of detecting said marks.

29. An exposure method as recited in claim 28, wherein said electromagnetic wave beam is an optical beam.

30. An exposure method for transferring a pattern image of a mask to a substrate comprising the steps of:

forming on said substrate at least two shot areas adjacent to each other;

transferring the pattern image of said mask to one shot area of said at least two shot areas;

detecting marks formed on said substrate while moving said substrate before transferring the pattern image of said mask to the other shot area to be exposed next; and performing alignment between said substrate and said mask on the basis of the detecting step.

31. An exposure method as recited in claim 30, further comprising the step of synchronously moving said mask and said substrate to perform a scanning exposure to transfer the pattern image to the other shot area of said substrate, and wherein said detecting step is performed during the synchronous movement of said mask and said substrate.

32. An exposure method as recited in claim 30, wherein said marks formed on said substrate are regular marks continuously formed over said plurality of shot areas on said substrate.

33. An exposure method as recited in claim 32, wherein said regular marks are formed on said substrate in a direction in which said substrate moves.

34. An exposure method as recited in claim 32, wherein said continuously formed regular marks are arranged in a plurality of lines on said substrate.

35. An exposure method as recited in claim 34, wherein said regular marks are formed in a substantially entire surface of said substrate.

36. An exposure method as recited in claim 30, further comprising the step of applying an electromagnetic wave beam to said marks at the step of detecting said marks.

37. An exposure method as recited in claim 36, wherein said electromagnetic wave beam is an optical beam.

* * * * *